United States Patent [19]

Wills et al.

[11] Patent Number: 5,008,729
[45] Date of Patent: Apr. 16, 1991

[54] LASER PROGRAMMING OF SEMICONDUCTOR DEVICES USING DIODE MAKE-LINK STRUCTURE

[75] Inventors: Kendall S. Wills; Paul A. Rodriguez, both of Houston, Tex.

[73] Assignee: Texas Instruments Incorporated, Dallas, Tex.

[21] Appl. No.: 415,445

[22] Filed: Sep. 28, 1989

Related U.S. Application Data

[60] Continuation of Ser. No. 237,260, Aug. 26, 1988, abandoned, which is a division of Ser. No. 621,837, Jun. 18, 1984, abandoned.

[51] Int. Cl.$^5$ ............................................. H01L 27/02
[52] U.S. Cl. ........................................ 357/51; 357/41; 357/42; 357/86
[58] Field of Search ......................... 357/41, 42, 51, 86

[56] References Cited

U.S. PATENT DOCUMENTS

| | | | |
|---|---|---|---|
| 3,733,690 | 5/1973 | Rizzi et al. ........................... | 29/577 |
| 4,139,786 | 2/1979 | Raymond, Jr. et al. ............. | 307/238 |
| 4,238,839 | 12/1980 | Redfern et al. ...................... | 357/41 |
| 4,295,897 | 10/1981 | Tubbs et al. ......................... | 357/42 |
| 4,387,503 | 12/1983 | Aswell et al. ....................... | 357/51 |
| 4,435,895 | 3/1984 | Parillo et al. ........................ | 29/571 |
| 4,480,375 | 11/1984 | Cottrell et al. ...................... | 357/42 |
| 4,561,906 | 12/1985 | Calder et al. ........................ | 148/1.5 |
| 4,590,388 | 5/1986 | Clemons et al. .................... | 357/51 |
| 4,783,424 | 11/1988 | Ohno et al. .......................... | 357/51 |
| 4,785,199 | 11/1988 | Kolodny et al. ..................... | 307/451 |

FOREIGN PATENT DOCUMENTS

| | | | |
|---|---|---|---|
| 0076967 | 4/1983 | European Pat. Off. .............. | 357/59 |
| 58-0115692 | 7/1983 | Japan ................................... | 357/59 |

OTHER PUBLICATIONS

(No author given), "Photon Assisted Programming Technique for Polysilicon Fuses and Anti-Fuses", *IBM Technical Disclosure Bulletin*, vol. 27, No. 10A, 3/85, pp. 5715-5716.

North et al., "Laser Coding of Bipolar Read-Only Memories", *IEEE Journal of Solid-State Circuits*, vol. SC-11, No. 4, 8/76, pp. 500-505.

*Primary Examiner*—J. Carroll
*Attorney, Agent, or Firm*—Ronald O. Neerings; Thomas W. Demond; Melvin Sharp

[57] ABSTRACT

A semiconductor device is programmed by a laser beam which causes a PN junction in a silicon substrate to be permanently altered. This produces a leakage path between a program node and a tank region in the substrate; the program node can be an input to a transistor in a CMOS circuit, for example, so this node will always hold the transistor on or off depending whether or not it has been laser-programmed. Preferably, the tank region is of opposite type compared to the substrate, so the program node is electrically isolated from the substrate in either case.

18 Claims, 4 Drawing Sheets

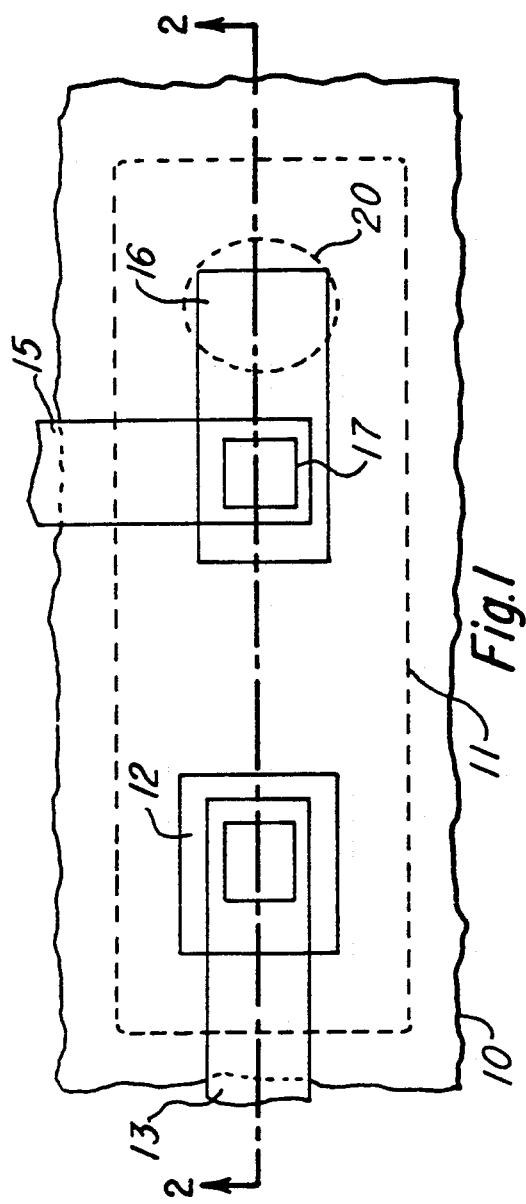
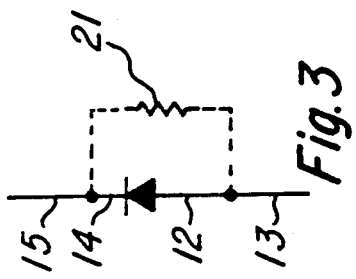
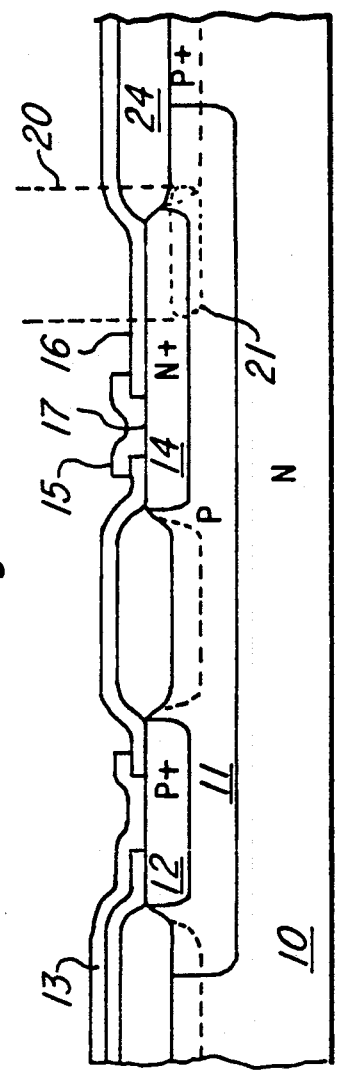

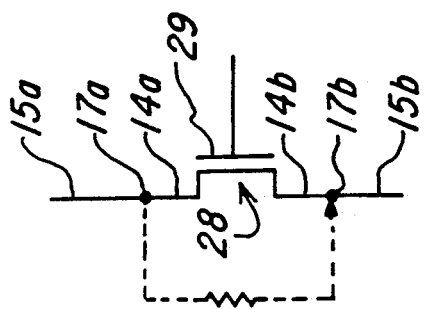
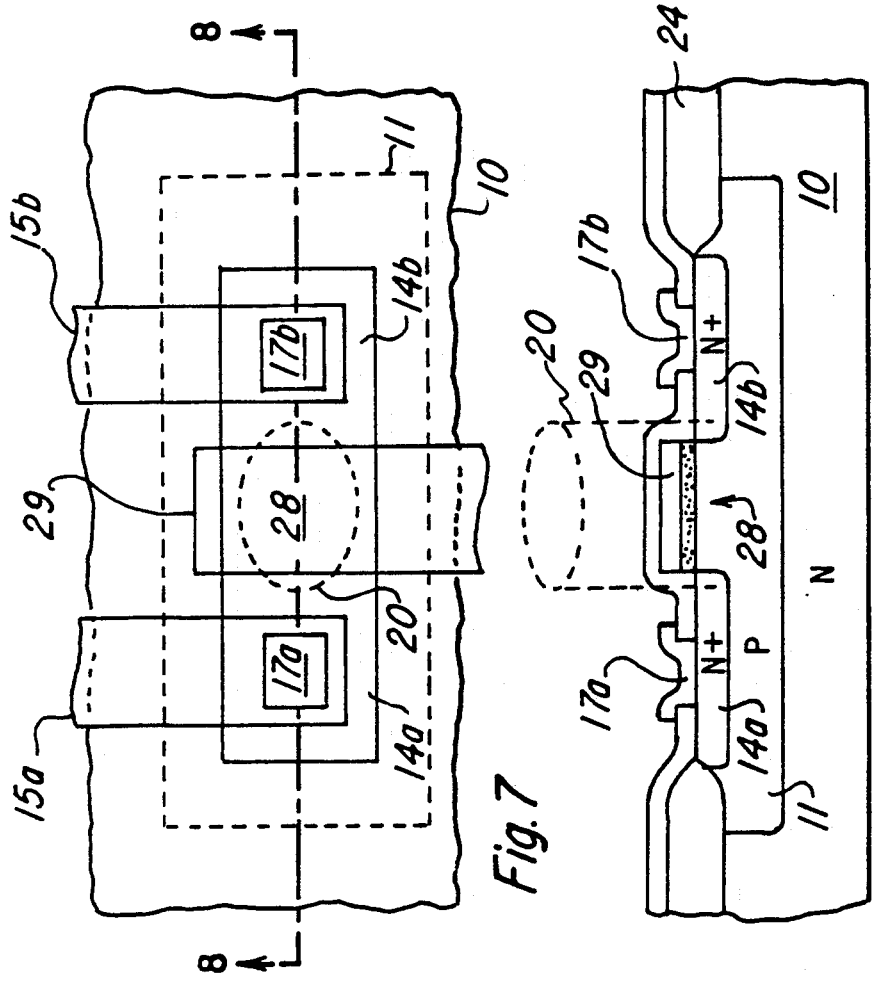
Fig. 9
Fig. 7
Fig. 8

LASER PROGRAMMING OF SEMICONDUCTOR DEVICES USING DIODE MAKE-LINK STRUCTURE

This application is a continuation, of application Ser. No. 07/237,260, filed 08/26/88, abandoned, which is a division of application Ser. No. 621,837, filed June 18, 1984 abandoned.

BACKGROUND OF THE INVENTION

This invention relates to semiconductor devices, and more particularly to laser programming of such devices.

Various methods have been employed for selectively programming semiconductor devices after manufacture is essentially complete. For example, redundant memory chips are programmed after testing to bypass faulty parts of the memory. In one commonly used method, a polysilicon or other conductive strip on the surface of the chip is melted through by a laser beam at the desired positions; this is known as laser break-link programming. In bipolar PROMs, conductors are melted at narrow high resistance areas by electrical pulses. In some devices of this type an oxide is broken down by a laser beam or by over voltage shorting together two conductors and providing make-link instead of break-link programming. The heating effect of a laser beam has also been used to diffuse impurity into a silicon or polysilicon area to change its conductivity-providing a programming method. The effects of laser heating for altering the dopant distribution in silicon devices has been reported.

It is the principal object of this invention to provide an improved method of programming of semiconductor devices, particularly by laser beam make-link programmable elements. Another object is to provide a laser programming method which requires less space on the semiconductor substrate for implementation. A further object is to provide a laser programming method which is less disruptive of the surrounding structure and materials, and/or which leaves a minimum of residue. Other objects include lower dwell time needed for the laser beam (thus faster programming) and lower power (thus less heating).

SUMMARY OF THE INVENTION

In accordance with one embodiment of the invention, a semiconductor device is programmed by a laser beam which causes a PN junction in a silicon substrate to be permanently altered. This produces a leakage path between a program node and the substrate; the program node can be an input to a transistor in a CMOS circuit, for example, so this node will always hold the transistor on or off depending upon whether or not it has been laser-programmed. Preferably, the tank region is of opposite type compared to the substrate, so the program node is electrically isolated from the substrate in either case.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a plan view, greatly enlarged, of a part of a semiconductor chip having the make-link laser beam programmable structure of the invention;

FIG. 2 is an elevation view in section of the device of FIG. 1, taken along the line 2—2 in FIG. 1;

FIG. 3 is an electrical schematic diagram of the circuit of the device of FIGS. 1 and 2, according to the invention;

FIG. 7 is a plan view, greatly enlarged, of a part of a semiconductor chip having the make-link laser beam programmable structure according to still another embodiment of the invention;

FIG. 8 is an elevation view in section of the device of FIG. 7, taken along the line 8—8 in FIG. 7;

FIG. 9 is an electrical schematic diagram of the circuit of the device of FIGS. 7 and 8, according to the invention;

DETAILED DESCRIPTION OF THE SPECIFIC EMBODIMENT

Figure 6:
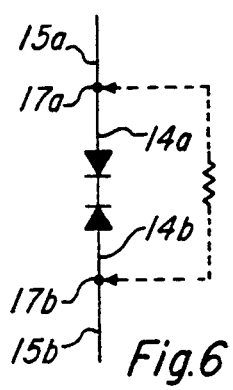
FIG. 6 is an electrical schematic diagram of the circuit of the device of FIGS. 4 and 5, according to the invention.

Referring to FIGS. 1, 2 and 3, a laser beam programmed, make-link structure for a CMOS type semiconductor device is illustrated according to the invention. A silicon substrate 10, in this case N type, has a P tank 11 formed in the top face, in the manner of U.S. Pat. No. 4,295,897, assigned to Texas Instruments. The substrate can be P type and an N type tank used, in which case the conductivity types of the regions are reversed. For the P tank version, a P+ contact region 12 is formed for a low resistance ohmic contact between a conductive strip 13 and the tank 11, and a diode is created by an N+ region 14 to which a metal strip 15 is connected. A programming area 16 is provided which is spaced from the metal-to-silicon contact area 17. A laser beam 20 is focused onto this area 16 with a beam energy sufficient to cause a permanent leakage path at the junction area 21 due to heating. The beam energy need not be high enough to melt the metal 15, the silicon of region 14, or the overlying oxide 22. For example, the beam energy might be 0.5 μJ, with a dwell time of 35 nsec and a spot size of about 6 to 8 microns. As indicated in FIG. 3, when the region 21 is irradiated, the diode is permanently replaced by a shorting resistor. This is probably due to a surface-effect at the PN junction where it interfaces with the oxide.

Figure 4:
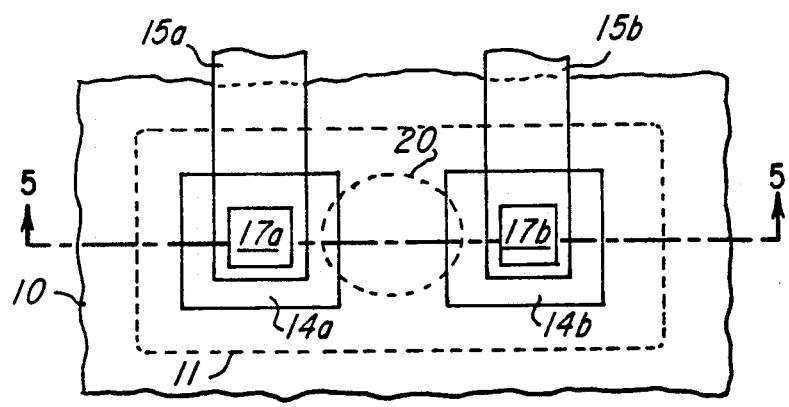
FIG. 4 is a plan view, greatly enlarged, of a part of a semiconductor chip having the make-link laser beam programmable structure according to another embodiment of the invention.
Figure 5:
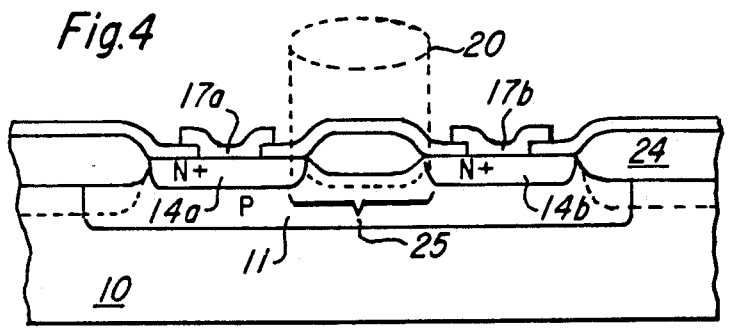
FIG. 5 is an elevation view in section of the device of FIG. 4, taken along the line 5—5 in FIG. 4.

Another embodiment of the invention is shown in FIGS. 4, 5 and 6. In this embodiment, the N+ region 14 is split into two separate regions 14a and 14b, with a metal-to-silicon contact to each of these regions at areas 17a and 17b. An area 24 of thick field oxide separates the region 14a and 14b along the face of the silicon bar. The laser beam 20 is impinged upon an area 25 through the field oxide and functions to cause a permanent leakage path between the two regions 14a, 14b. Again, this functions as a resistor shorting the diodes as seen in FIG. 6. Alternatively, the two PN junctions could be moved inwardly toward one another due to laser heating until they overlap. The energy level of the beam 20 to accomplish this is about the same as above. The tank 11 isolates the programmed node from the substrate as before.

Still another embodiment is illustrated in FIGS. 7, 8, and 9. This is similar to that of FIGS. 4, 5, and 6 but an MOS transistor 28 with a polysilicon gate 29 separates the two N+ regions 14a and 14b (instead of field oxide 24). The laser beam 20 functions to render the transistor permanently of low threshold or depletion mode, i.e. to greatly change its threshold voltage so it appears in the circuit as a low resistance (or depending upon the materials, switches from low resistance to high resistance) due to the selectively-applied laser beam. As before, the concept can be used for P-channel or N-channel transistors, in an N tank or P tank.

Figure 10:
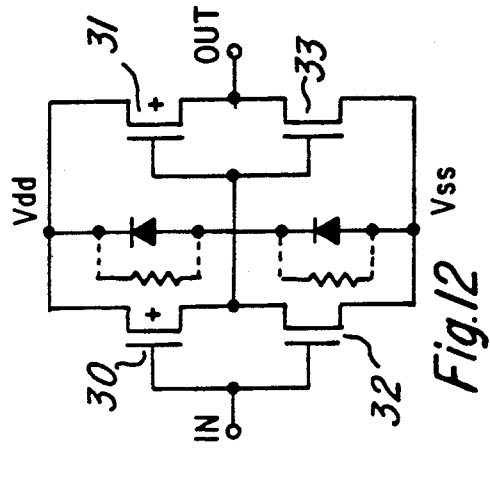
FIGS. 10, 11, 12, 13, and 14 are electrical schematic diagrams of CMOS circuits with the devices of FIGS. 1-9.
Figure 11:
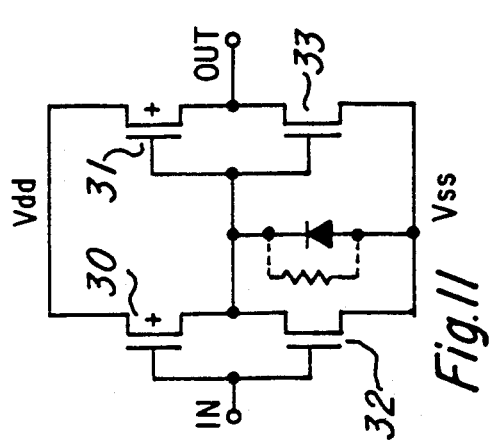
Figure 12:
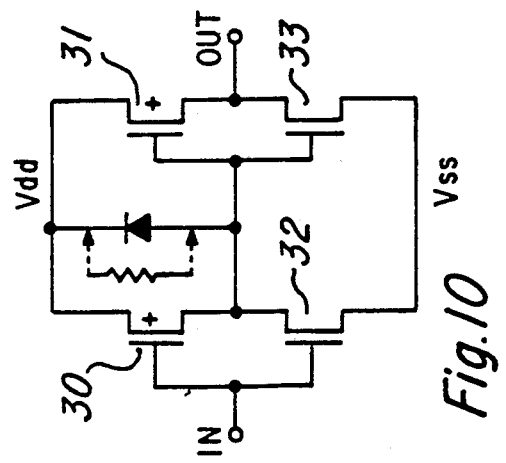

CMOS circuits in which the programmable devices of FIGS. 1-6 may be used are illustrated in FIGS. 10, 11 and 12. A laser programmed diode may be used between Vdd and an intermediate node as in FIG. 10, and between the intermediate node and Vss as in FIG. 11, in a CMOS inverter having P-channel transistors 30, 31 and N-channel transistors 32 and 33. Or two of the devices may be used as in FIG. 12, in which case the output may be clamped high or low, depending upon which device is laser-programmed, or if neither then the circuit will pass signals unchanged.

Figure 13:
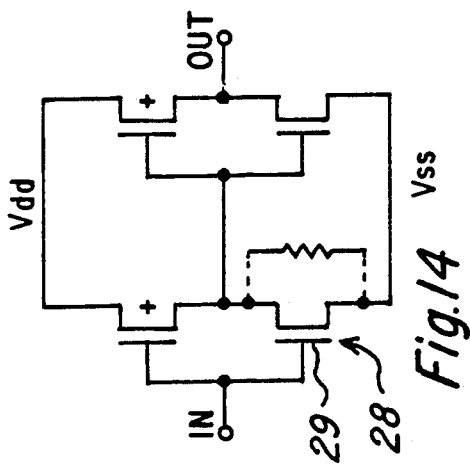
Figure 14:
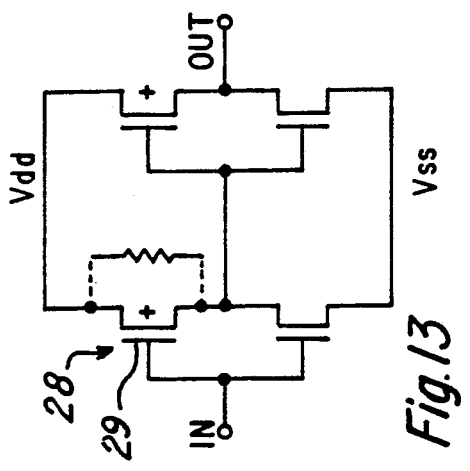

Likewise, circuits using the laser activated transistors of FIGS. 7, 8 and 9 are shown in FIGS. 13 and 14, otherwise corresponding to the circuits of FIGS. 10 and 11.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. An integrated circuit with laser programmable links in a semiconductor body comprising:
   (a) a first PN junction formed in a region of said body having a first conductivity type with a programming area within the PN junction for receiving a laser beam, said first PN junction being separate and distinct from other electrical components and normally presenting a high resistance to current flow in a certain direction;
   (b) a second PN junction formed in a region of said body having a second conductivity type with a programming area within the PN junction for receiving a laser beam, said second PN junction being separate and distinct from other electrical components and normally presenting a high resistance to current flow in a particular direction;
   (c) a circuit including said first and second PN junctions and having an input and an output, said output clamped at a first level if said first PN junction is make-link programmed to form a low resistance to current flow in said certain direction, and said output clamped at a second level if said second PN junction is make-link programmed to form a low resistance to current flow in said particular direction.

2. The integrated circuit as in claim 1 wherein said first PN junction is located in a well of said first conductivity type.

3. The integrated circuit as in claim 1 wherein said second PN junction is located in a well of said second conductivity type.

4. The integrated circuit as in claim 1 wherein said first PN junction is located in a well of said first conductivity type and said second PN junction is located in a well of said second conductivity type.

5. The integrated circuit as in claim 1 wherein a region above said first and second PN junctions is not disrupted by make-link programming.

6. The integrated circuit as in claim 1 wherein said certain direction and said particular direction are the same direction.

7. The integrated circuit as in claim 1 wherein said certain direction and said particular direction are different directions.

8. A programmable integrated CMOS inverter circuit comprising:
   a semiconductor material having a surface of a first conductivity type;
   a well of a second conductivity type formed in said surface;
   a first transistor having first and second source/drain regions of the second conductivity type formed in said surface of the first conductivity type and a gate electrode, said first region connectable to a first voltage level;
   a second transistor having first and second source/drain regions of the first conductivity type formed in said well and a gate electrode, said second region connectable to a second voltage level, said first transistor gate electrode electrically connected to said second transistor gate electrode to form a first inverter input node, said second source/drain region of said first transistor connected to said first source/drain region of said second transistor to form a first inverter output node;
   a resistance programmable area formed of a PN junction, separate and distinct from each transistor, formed in said surface of the first conductivity type for selectably connecting, without melting, said first and second source/drain regions of said first transistor with a low resistance; and
   a circuit including said PN junction and having an input and an output, said output clamped at a first level if said PN junction is make-link programmed to form a low resistance to current flow in a certain direction.

9. The circuit of claim 8 wherein said resistance programmable area formed of a PN junction connects said first and second source/drain regions of said second transistor.

10. The circuit of claim 8 further including a second resistance programmable area formed of a second PN junction, separate and distinct from each transistor, formed in said well for selectably connecting said first and second source/drain regions of said second transistor, said output clamped at said first level if said first PN junction is make-link programmed to form a low resistance to current flow in said certain direction, and said output clamped at a second level if said second PN junction is make-link programmed to form a low resistance to current flow in a particular direction.

11. The circuit of claim 10 wherein said certain direction and said particular direction are the same direction.

12. The circuit of claim 10 wherein said certain direction and said particular direction are different directions.

13. The circuit of claim 8 wherein said well is of p-conductivity type.

14. The circuit of claim 8 wherein said semiconductor material is a silicon substrate.

15. The circuit of claim 8 wherein the PN junction is convertible into a shorting resistor by irradiation.

16. The circuit of claim 8 wherein said PN junction is a diode.

17. The circuit of claim 8 further including: a third transistor having first and second source/drain regions of the second conductivity type formed in said surface of the first conductivity type and a gate electrode connected to the first inverter output node, said first region connectable to the first voltage level; and a fourth transistor having first and second source/drain regions of the first conductivity type formed in said well and a gate electrode connected to the first inverter output node, said second region connectable to the second voltage level, said second source/drain region of said third transistor connected to said first source/drain region of said fourth transistor to form a second inverter output node.

18. The circuit of claim 4 further including a second resistance programmable area formed of a second PN junction, separate and distinct from each transistor, formed in said well for selectably connecting said first and second source/drain regions of said second transistor.

* * * * *